United States Patent [19]
Nordholt

[11] Patent Number: 4,870,383
[45] Date of Patent: Sep. 26, 1989

[54] OSCILLATOR CIRCUIT

[75] Inventor: Ernst H. Nordholt, Berkel en Rodenrijs, Netherlands

[73] Assignee: U.S. Philips Corporation, New York, N.Y.

[21] Appl. No.: 283,651

[22] Filed: Dec. 13, 1988

[30] Foreign Application Priority Data

Dec. 30, 1987 [NL] Netherlands .......................... 8703160

[51] Int. Cl.[4] ............................................. H03B 5/36
[52] U.S. Cl. ............................ 331/116 R; 331/108 C; 331/158; 331/173
[58] Field of Search ........ 331/116 R, 116 FE, 117 R, 331/117 FE, 158, 159, 173, 108 C

[56] References Cited

U.S. PATENT DOCUMENTS 4,574,257 3/1986 Kasperkovitz et al. ........ 331/116 R

Primary Examiner—David Mis
Attorney, Agent, or Firm—Bernard Franzblau

[57] ABSTRACT

An oscillator circuit comprising a feedback amplifier circuit having a power supply terminal, a resonant circuit comprising a crystal, and a differential amplifier which is coupled to a bias current source which is switchable stepwise by means of a level detector for the stepped excitation of the resonant circuit from a predetermined potential at the power supply terminal. When switching on the power supply voltage, the level detector insures that the resonance of the oscillator circuit is achieved in a defined and a reproducible way.

6 Claims, 1 Drawing Sheet

OSCILLATOR CIRCUIT

BACKGROUND OF THE INVENTION

The invention relates to an oscillator circuit comprising a feedback amplifier circuit having a power supply terminal, a resonant circuit comprising a crystal and a differential amplifier which is coupled to a bias current source. A crystal oscillator circuitt of this type is known, inter alia, from U.S. Pat. No. 4,574,257.

The starting behavior of crystal oscillators upon switching on the power supply voltage is greatly dependent on thew ay in which a sufficient quantity of energy is supplied to the crystal to achieve resonance. The quantity of supplied energy is mainly determined by thew ay in which the power upply voltage is built up, which depnds, inter alia, on the decoupling capacitors for the power supply voltage used inthe circuit, on the implementation of D.C. bias circuits in the circuit and on the noise applied to the crystal. Consequently, crystal oscillators have an undenfined, non-reproducible starting behaviour in practice.

However, such an undenfined, non-reproducible starting behaviour causes difficulties when testing crystal oscillators. The total test period of, for example, integrated circuits is approximately 4 to 5 seconds depend on their volume. However, if these integrated circuits comprise a crystal oscillator, the total test period is extended by the period which is required to make the oscillator resonate. Sine this period, as stated above, cannot be laid down or is not known in advance, a waiting time with a safety margin of the order of approximately 0.5 sec. is generally used in practice. This means that the total test period of integrated circuits comprising a crystal oscillator is approximately 10% longer than that of corresponding circuits without crystal oscillators. It will therefore be evident that the total time which is required to manufacture integrated circuits comprising a crystal oscillator is also longer. A reduction of the total manufacturing period of such integrated circuits may not only have a cost saving effect in practice, but it also provides the possibility of increasing the total production.

It is known from IBM Technical Disclosure Bulletin, Vol. 21, No 2, July 1978, pp. 492–493 that the starting behaviour of a crystal oscillator circuit can be improved by stepped excitation of the resonant circuit. An oscillator is shown in which the excitation is realised by stepped interruption of a current through a coil which forms part of the resonant circuit. The sudden interruption of the current causes a change of the voltage across the coil so that the oscillator circuit starts. However, this known method of excitation is only effective in crystal oscillator circuits in which the resonant circuit incorporates a coil and it is not suitable for an oscillator circuit of the type described in the opening paragraph.

SUMMARY OF THE INVENTION

The invention has for its object to improve the starting behaviour of the types of oscillator circuit described in the opening paragraph. According to the invention this is achieved in that the bias current source is switchable stepwise by means of a level detector for the stepped excitation of the resonant circuit from a predetermined potential at the power supply terminal.

As soon as the power supply voltage of the amplifier circuit has reached a predetermined value at which the feedback amplifier can certainly oscillate, the level detector supplies a stepped signal which switches on the bias current source and hence the entire amplifier circuit. This results in a stepped supply of energy to the crystal so that this crystal achieves resonance in a defined and reliable way.

The value of the power supply voltage at which the level detector switches on the bias current source of the amplifier circuit is of course dependent on the implementation and the type of amplifier circuit and may be determined in advance (for example, by way of experiment).

By starting the oscillator circuit in this defined way, the moment at which the oscillator circuit will definitely achieve resonance can accurately be fixed in advance when testing integrated circuits comprising a crystal oscillator circuit. The waiting time used in practice for testing crystal oscillator circuits according to the prior art can be reduced to the time which is at least required to achieve resonance when using the level detection circuit according to the invention. Typically, the afore-mentioned waiting time of 0.5 sec. can be reduced to several tens of milliseconds with the circuit according to the invention. The test period of integrated circuits comprising one or more crystal oscillator circuits according to he invention can therefore be shorter than the test period of corresponding circuits comprising known crystal oscillators.

In addition to the advantage of a faster rate of processing or a shorter time cycle, the crystal oscillator circuit according to the invention has the advantage that the loop gain of the amplifier circuit may be lower, due to the stepped excitation of this circuit, than the loop gain values which crystal manufacturers normally recommend to achieve resonance of the crystal. A lower loop gain improves the noise behaviour of oscillator circuit.

An embodiment of a crystal oscillator circuit according to the invention is characterized in that the level detector comprises an emitter-coupled transistor pair having a first and a second transistor, the base of said first transistor being coupled to a threshold circuit and the base of said second transistor being coupled to the power supply terminal and its collector being coupled to an input of a first current mirror, a first output of which is coupled to the base of the second transistor and a second output of which is coupled to the bias current source.

A level detector formed in this way is a combined comparator and trigger circuit which is insensitive to interference signals on the power supply voltage, thus preventing unwanted excitations of the feedback amplifier circuit.

BRIEF DESCRIPTION OF THE DRAWING

The invention will now be described in greater detail, by way of example, with reference to the drawing which shows a crystal oscilltor circuit which is particularly suitable for use in integrated circuits.

DESCRIPTION OF THE PREFERRED EMBODIMENTS

Figure 1:
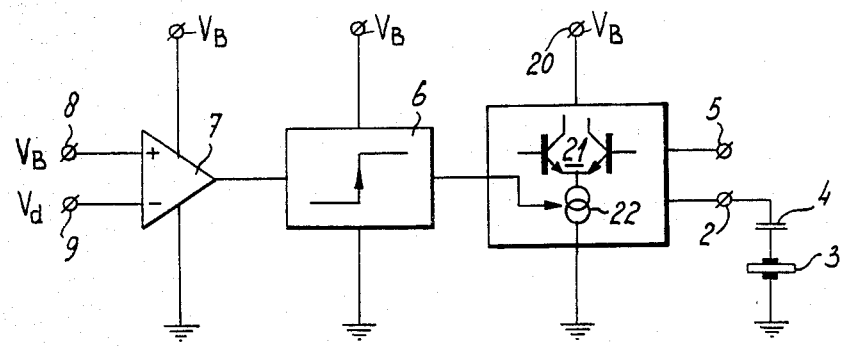
FIG. 1 is a block-schematic diagram of the principle of the crystal oscillator circuit according to the invention.

The block-schematic diagram of FIG. 1 comprises a feedback amplifier circuit 1 having an output terminal 2 to which a resonant circuit comprising a series arrangement of a crystal 3 and a capacitor 4 are connected to ground. Instead of being connected to ground, the resonant circuit may also be connected between the output terminal 2 and the positive or negative power supply terminal of the oscillator circuit. If necessary, the capacitor 4 may be replaced by a short circuit. Instead of the reasonant circuit shown, the resonant circuit described in the above cited U.S. Pat. No. 4,574,257 may be used alternatively. The output signal of the oscillator circuit is available at terminal 5. The amplifier circuit 1 is fed from a power supply terminal 20 to which the power supply voltage $V_B$ is connected and it comprises a differential amplifier 21 and a switchable bias current source 22 supplying a direct current to the differential amplifier.

A level detector including a trigger circuit 6 which is triggered by the output signal of a comparator 7 is also coupled to the amplifier circuit 1. The power supply voltage $V_B$ is connected to one input 8 of the comparatoro 7 and a threshold voltage $V_d$ is present at the other input 9. Instead of the full power supply voltage $V_B$ a part of the power supply voltage can be applied to the input 8 of the comparator 7 by means of, for example, a voltage divider ciricuit (not shown).

As soon as the voltage at the input terminal 8 of the comparatoro 7 exceeds the threshold voltage at the input terminal 9 thereof, a trigger signal is applied to the trigger circuit 6 which applies a stepped excitation signal to the amplifier circuit 1. As a result of this stepped excitation signal a quantity of energy with which the crystal 3 is made to resonate is suddenly applied to this crystal.

The choice of the threshold voltage $V_d$ at the input 9 of the comparator 7 is determined by the value of the power supply voltage $V_B$ at which the amplifier circuit 1 has reached such a setting that a resonance signal can be generated. The value of Vhd d is of course dependent on the type of amplifier circuit and on the implementation of its various D.C. bias cicuits.

Figure 2:
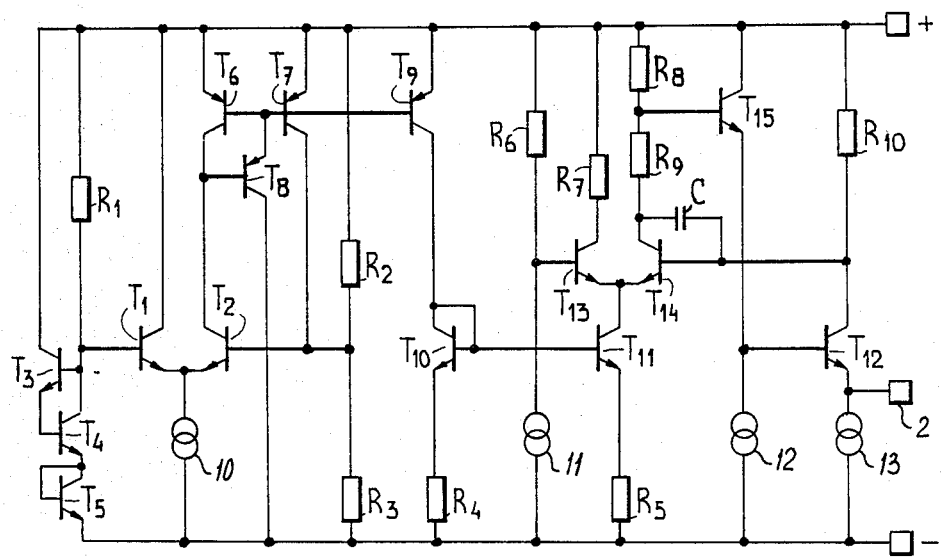
FIG. 2 is a basic circuit diagram for use in the integrated semiconductor tecnique.

FIG. 2 is a basic circuit diagram of a preferred embodiment of an oscillator circuit comprising a level detector according to the invention which is particularly suitable for use in an integrated circuit.

The level detector comprises a combined comparator/trigger circuit consisting of the emitter-coupled transistor pair constituted by the transistors $T_1$ and $T_2$. The base of the transistor $T_1$ is connected to the common negative power supply terminal via a threshold circuit of three semiconductor junctions constituted by the transistors $T_3$, $T_4$ and $T_5$ and to the common positive power supply terminal via a resistor $R_1$. A part of the power supply voltage predetermined by the resistive voltage divider $R_2$, $R_3$ 3 is present at the base of the transistor $T_2$. The collector of the transistor $T_1$ is connected to the positive power supply terminal and the collector of the transistor $T_2$ is connected to the input of a known current mirror circuit constituted by the transistors $T_6$, $T_7$ and $T_8$ and is arranged as shown in FIG. 2. THe output of the current mirror constituted by the collector of the transistor $T_7$ is connected to the base of the transistor $T_2$. The emitters of the transistors $T_1$ and $T_2$ are connected together and to the negative power supply terminal via a current reference element 10.

The level detector thus formed is an integrated form of a bistable trigger circuit of the Schmitt-type. As long as the voltage at the base of the transistor $T_2$ is smaller than the threshold value constituted by the three semiconductor junctions at the base of othe transistor $T_1$, no current flows in the collector lead of the transistor $T_2$. As soon as the voltage at the base of the transistor $T_2$ exceeds the threshold value at the base of the transistor $T_1$ as a result of the increase of the power supply voltage Vhd B of the circuit, the current through the transistor $T_1$ will be taken over in a stepped form by the transistor $T_2$. Since the output of the current mirror $T_6$, $T_7$, $T_8$, i.e. the collector of othe transistor $T_7$, is coupled to the base of the transistor $T_2$, this transistor $T_2$ will also remain turned on when the voltage at the base of the transistor $T_2$ becomes lower than the voltage at the base of the transistor $T_1$ as a result of, for example, interference pulses or other influences.

Due to the currentn through the current mirror $T_6$, $T_7$, $T_8$ a current will also flowo through the transistor $T_9$ which, as is shown, is coupled thereto. The collector lead of the transistor $T_9$ incorporates a further current mirror comprising the transistors $T_{10}$ and $T_{11}$. The bases of the transistors $T_{10}$ and $T_{11}$ are interconnected and are connected to the collector of the transistor $T_9$. The emitter of the transistor $T_{10}$ is connected to the negative power supply terminal via a resistor $R_4$ and the emitter of the transistor $T_{11}$ is connected to this terminal via a resistor $R_5$. THe values of the resistors $R_4$, $R_5$ determine the respective input and output currents of this current mirror.

The transistor $T_{11}$ is incorporated as a switchable current source in the power supply circuit of the actual resonant circuit which is constituted by the transistor $T_{12}$ arranged as an amplifier, which is fed back via a differential amplifier operating as an inverting symmetrical voltage limiter and comprising the transistors $T_{13}$ and $T_{14}$, and a transistor $T_{15}$ arranged as an emitter follower.

The collector of the transistor $T_{12}$ is connected via a resistor $R_{10}$ to the positive power supply terminal and its emitter is connected via a current source 13 to the negative power supply terminal. The emitter of $T_{12}$ constitutes the terminal 2 for the resonant circuit in accordance with FIG. 1. The emitters of the transistors $T_{13}$ and $T_{14}$ are interconnected and are connected to he collector of the transistor $T_{11}$. The base of the transistor $T_{13}$ is connected via a current source 11 to the negative power supply terminal and via a resistor $R_6$ to the positive power supply terminal. The collector of the transistor $T_{13}$ is also coupled to the positive power supply terminal via a resistor $R_7$. The collector of the transistor $T_{14}$ is connected to the positive power supply terminal via a series arrangement of two resistors $R_8$ and $R_9$, while the junction point of the two resistors is connected to the baase of a transistor $T_{15}$ whose collector is connected to the positive power supply terminal and whose emitter is connected via a current source 12 to the negative power supply termnal. The emitter of the transistor $T_{15}$ is also connected to the base of the transistor $T_{12}$ and the base of the transistor $T_{14}$ is connected to the collector of the transistor $T_{12}$.

During resonance the collector of the transistor $T_{12}$ conveys a sinusoidal signal whose frequency corresponds to the resonance frequency of the resonant circuit connected to the point 2. By means of the difference pair $T_{13}$, $T_{14}$ the signal at the collector of $T_{12}$ is symmetrically limited, inverted and fed back via the transistor $T_{15}$ to the base of the transistor $T_{12}$ via the voltage divider constituted by the resistors $R_8$ and $R_9$. The amplifier transistor $T_{12}$ has a somewhat negative collector-base voltage which limits the amplitude of the sinusoidal voltage at its collector to several hundreds of millivolts. This value is, however, sufficient to cause the difference pair constituted by the transistors $T_{13}$ and $T_{14}$ to operate as a switch so that their collectors convey square-wave-shaped signals having a frequency which is equal to the resonance frequency. The transistor $T_{15}$ arranged as an emitter follower increases the control range of the amplifier circuit but, if necessary, it may be replaced by a short circuit between the junction point of the resistors $R_8$ and $R_9$ and the base of the transistor $T_{12}$, while the current source 12 is then redundant.

The amplitude of the square wave at the collector ofo the transistor $T_{14}$ should be such that the peak value of the currentn in the crystal does not exceed the bias current of the transistor $T_{12}$ supplied by the current source 13 when this square-wave voltage is applied to the crystal via the voltage divider $R_8$, $R_9$ and the transistor $T_{15}$. Since the series rsonance resistance of the crystal is of the order of 50 ohm, the peak value of the voltage should be maintained very small if the entire circuit works on a lower power, which will substantially always be the case in, for example, integrated circuited.

The feedback capacitance C arranged between the base and the collector of the transistor $T_{14}$ constituted, together with the resistor $T_9$, an increase of the capacitive load of the amplifier transistor $T_{12}$ so that an increase of the loop gain due to a capacitance incorporated in the resonant circuit is reduced and the stability of the oscillator circuit is improved. The operation of the resonant circuit has been described in greater detail in Proceedings 30th Midwest Symposium on Circuits and Systems, June 3–5, 1987, Syracuse, USA.

Tests performed with the crystal oscillator shown in FIG. 2 according to the invention have proved that a very stable and reliable starting behaviour can be obtained, even with crystals which had been rejected by the manufacturer because their series resonance resistance was dependent to an unwanted extent on their control level.

It will be evident that the invention is not limited to the embodiment shown, but may also be used, for example, for an oscillator circuit in accordance with U.S. Pat. No. 4,574,257 whose amplifier circuit is also fed via a current source and can therefore be switched on by means of a current mirror $T_{10}$, $T_{11}$ in a similar way as is shown in FIG. 2. Those skilled in the art can replace the combination of bistable trigger circuit and comparator circuit shown by various known trigger circuits and comparator circuits in a relatively easy way without passing beyond the scope of the invention. Although only transistors of the bipolar type are shown in FIG. 2, the oscillator circuit according to the invention may of course also be designed in other semiconductor technologies such as CMOS or BIMOS.

What is claimed is:

1. An oscillator circuit comprising a feedback amplifier circuit haing a power supply terminal, a resonant circuit comprising a crystal, and a differential amplifier coupled to a bias current source, characterized in that the bias current source is stepwise switchable by means of a level detector for the stepped excitation of the resonant circuit from a predetermined potential at the power supply terminal.

2. An oscillator circuit as claimed in claim 1, characterized in that the level detector comprises an emitter-coupled transistor pair including a first and a second transistor, the base of said first transistor being coupled to a threshold circuit and the base of said second transistor being coupled to the power supply terminal and its collector being coupled to an input of a first current mirror, a first output of which is coupled to the base of the second transistor and a second output of which is coupled to the bias current source.

3. An oscillator circuit as claimed in claim 2, characterized in that the bias current source is an output branch of a second current mirror, an input branch of which is coupled to the second output of the first current mirror.

4. An integrated oscillator circuit comprising a feedback amplifier circuit having a power supply terminal, a terminal for connecting a resonant circuit comprising a crystal, and a differential amplifier coupled to a bias current source, characterized in that the bias current source is stepwise switchable by means of a level detector for the stepped excitation of the resonant circuit from a predetermined potential at the power supply terminal.

5. An oscillator circuit as claimed in claim 4, characterized in that the level detector comprises an emitter-coupled transistor pair including a first and second transistor, the base of said first transistor being coupled to a threshold circuit and the base of said second transistor being coupled to the power supply terminal and its collector being coupled to an input of a first current mirror, a first output of which is coupled to the base of the second transistor and a second output of which is coupled to the bias current source.

6. An oscillator circuit as claimed in claim 5, characterized in that the bias current source is an output branch of a second ocurrent mirror, an input branch of which is coupled to the second output of the first current mirror.

* * * * *